United States Patent
Liou

(10) Patent No.: US 9,614,061 B2
(45) Date of Patent: Apr. 4, 2017

(54) SEMICONDUCTOR DEVICE HAVING FIN STRUCTURE THAT INCLUDES DUMMY FINS

(71) Applicant: UNITED MICROELECTRONICS CORP., Hsin-Chu (TW)

(72) Inventor: En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/188,998

(22) Filed: Jun. 22, 2016

(65) Prior Publication Data
US 2016/0300923 A1    Oct. 13, 2016

Related U.S. Application Data

(63) Continuation of application No. 14/588,989, filed on Jan. 5, 2015, now Pat. No. 9,385,220.

(30) Foreign Application Priority Data

Dec. 3, 2014    (TW) .............................. 103142048 A

(51) Int. Cl.
*H01L 29/78*    (2006.01)
*H01L 29/66*    (2006.01)
(Continued)

(52) U.S. Cl.
CPC .... *H01L 29/6681* (2013.01); *H01L 21/28518* (2013.01); *H01L 21/76895* (2013.01); *H01L 21/823431* (2013.01); *H01L 29/161* (2013.01); *H01L 29/165* (2013.01); *H01L 29/24* (2013.01); *H01L 29/267* (2013.01); *H01L 29/41791* (2013.01); *H01L 29/66795* (2013.01); *H01L 29/785* (2013.01); *H01L 29/7845* (2013.01); *H01L 29/7848* (2013.01); *H01L 29/7853* (2013.01); *H01L 29/7854* (2013.01); *H01L 29/7856* (2013.01); *H01L 2029/7858* (2013.01)

(58) Field of Classification Search
CPC ......... H01L 29/7856; H01L 2029/7858; H01L 21/28518; H01L 21/76895; H01L 21/823431; H01L 21/823456; H01L 27/0886; H01L 29/66795; H01L 29/6681; H01L 29/785; H01L 29/7851
See application file for complete search history.

(56) References Cited

U.S. PATENT DOCUMENTS 7,795,669 B2    9/2010  Georgakos et al.
2009/0224357 A1*  9/2009  Juengling ......... H01L 29/66545
                                                   257/506

(Continued)

*Primary Examiner* — Stephen W Smoot
(74) *Attorney, Agent, or Firm* — Winston Hsu; Scott Margo

(57) ABSTRACT

A semiconductor device includes: a substrate, a fin-shaped structure on the substrate, and a dummy fin-shaped structure on the substrate and adjacent to the fin-shaped structure. Preferably, the fin-shaped structure includes a gate structure thereon and a first epitaxial layer adjacent to two sides of the gate structure, and the dummy fin-shaped structure includes a second epitaxial layer thereon. A contact plug is disposed on the first epitaxial layer and the second epitaxial layer. In addition, the dummy fin-shaped structure includes a curve, in which the curve is omega shaped.

2 Claims, 3 Drawing Sheets

(51) Int. Cl.
*H01L 21/8234* (2006.01)
*H01L 29/417* (2006.01)
*H01L 21/285* (2006.01)
*H01L 21/768* (2006.01)
*H01L 29/165* (2006.01)
*H01L 29/267* (2006.01)
*H01L 29/161* (2006.01)
*H01L 29/24* (2006.01)

(56) References Cited

U.S. PATENT DOCUMENTS

| | | | |
|---|---|---|---|
| 2010/0109086 A1* | 5/2010 | Song | H01L 29/785 257/365 |
| 2013/0228866 A1 | 9/2013 | Lee | |
| 2013/0270639 A1 | 10/2013 | Lee | |
| 2014/0131813 A1 | 5/2014 | Liaw | |
| 2014/0141578 A1* | 5/2014 | Brink | H01L 27/1211 438/163 |
| 2014/0145247 A1 | 5/2014 | Cheng | |
| 2015/0303118 A1 | 10/2015 | Wang | |
| 2016/0155739 A1* | 6/2016 | Ting | H01L 29/0653 257/401 |

* cited by examiner

SEMICONDUCTOR DEVICE HAVING FIN STRUCTURE THAT INCLUDES DUMMY FINS

CROSS REFERENCE TO RELATED APPLICATIONS

This is a continuation application of U.S. application Ser. No. 14/588,989 (issued as U.S. Pat. No. 9,385,220) filed Jan. 5, 2015, and incorporated herein by reference in its entirety.

BACKGROUND OF THE INVENTION

1. Field of the Invention

The invention relates to a method for fabricating semiconductor device, and more particularly to a method of utilizing sidewall image transfer (SIT) technique for fabricating fin-shaped structures.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to a preferred embodiment of the present invention, a method for fabricating semiconductor device is disclosed. The method includes the steps of: providing a substrate; forming a sacrificial mandrel on the substrate, wherein the sacrificial mandrel comprises an indentation; and forming a spacer adjacent to the sacrificial mandrel.

According to another aspect of the present invention, a semiconductor device is disclosed. The semiconductor device includes: a substrate; a fin-shaped structure on the substrate, wherein the fin-shaped structure comprises a gate structure thereon and a first epitaxial layer adjacent to two sides of the gate structure; a dummy fin-shaped structure on the substrate and adjacent to the fin-shaped structure, wherein the dummy fin-shaped structure comprises a second epitaxial layer thereon; and a contact plug on the first epitaxial layer and the second epitaxial layer.

According to another embodiment of the present invention, a semiconductor device is disclosed. The semiconductor device includes: a substrate; a fin-shaped structure on the substrate; and a dummy fin-shaped structure on the substrate and adjacent to the fin-shaped structure, wherein the dummy fin-shaped structure comprises a curve.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
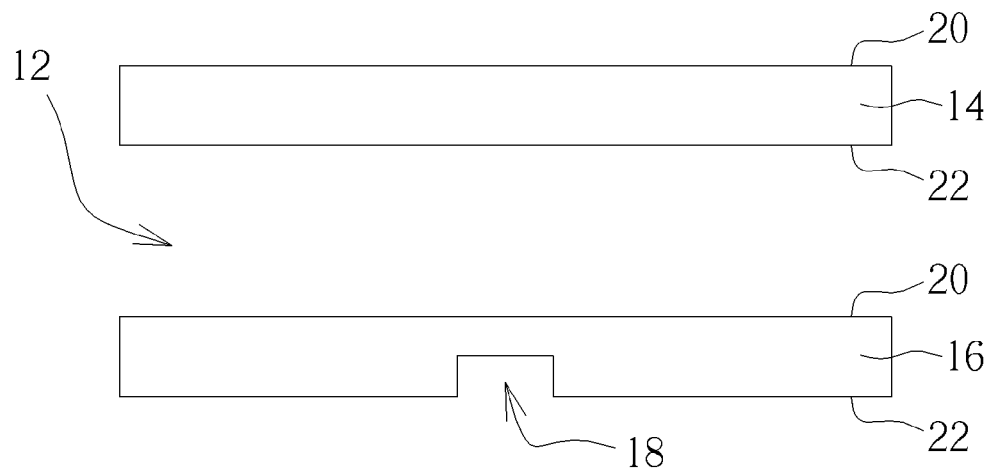
FIGS. 1-5 are top views illustrating a method for fabricating semiconductor device according to a preferred embodiment of the present invention.

Referring to FIGS. 1-5, FIGS. 1-5 are top views illustrating a method for fabricating semiconductor device according to a preferred embodiment of the present invention. As shown in FIG. 1, a substrate 12, such as a silicon substrate is provided, and at least one sacrificial mandrel, such as sacrificial mandrels 14 and 16 are formed on the substrate 12. In this embodiment, the formation of the sacrificial mandrels 14 and 16 could be accomplished by first covering a material layer (not shown) on the substrate 12 entirely, and then performing a pattern transfer process by using etching to remove part of the material layer for forming a plurality of patterned material layers serving as sacrificial mandrels 14 and 16 on the substrate 12. In this embodiment, the sacrificial mandrels 14 and 16 could be selected from the group consisting of polysilicon, silicon oxide, and silicon nitride, but not limited thereto. It should also be noted that even though two sacrificial mandrels 14 and 16 are disclosed in this embodiment, the quantity of the sacrificial mandrels 14 and 16 could also be adjusted according to the demand of the product, which is also within the scope of the present invention.

Next, a sacrificial mandrel cut process is conducted by first forming a patterned mask, such as a patterned resist on the sacrificial mandrels 14 and 16 to expose part of the sacrificial mandrel 16, and then removing part of the sacrificial mandrel 16 through etching process to form an indentation 18 or opening without separating the sacrificial mandrel 16. In this embodiment, the indentation 18 is preferably square shaped or rectangular shaped, but not limited thereto. For instance, the shape of the region exposed by the patterned resist could be adjusted according to the demand of the process to form indentation of any geometric shape, which are all within the scope of the present invention. Viewing from another perspective, each of the sacrificial mandrels 14 and 16 formed by the aforementioned cutting process preferably includes a first side 20 and a second side 22, in which the second side 22 of the sacrificial mandrel 16 includes the aforementioned indentation 18.

Figure 2:
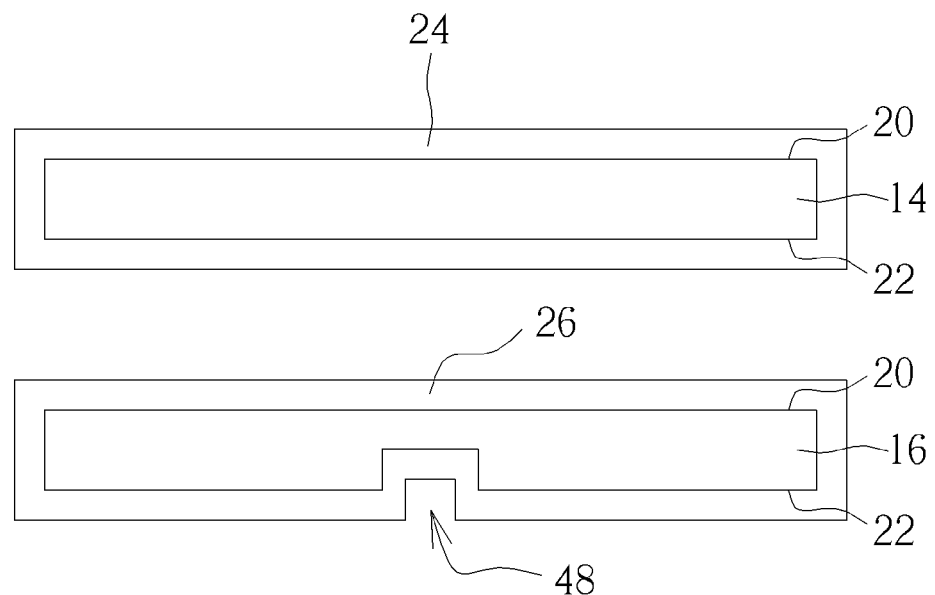

Next, as shown in FIG. 2, a cap layer (not shown) is formed to cover the sacrificial mandrels 14 and 16 and the substrate 12, and an etching back process is conducted to remove part of the cap layer for forming spacers 24 and 26 surrounding the sacrificial mandrels 14 and 16. It should be noted that since the second side 22 of the sacrificial mandrel 16 includes the indentation 18, the spacer 26 adjacent to the second side 22 preferably includes a turning point, such as a substantially c-shaped twist 48 shown in FIG. 2.

Figure 3:
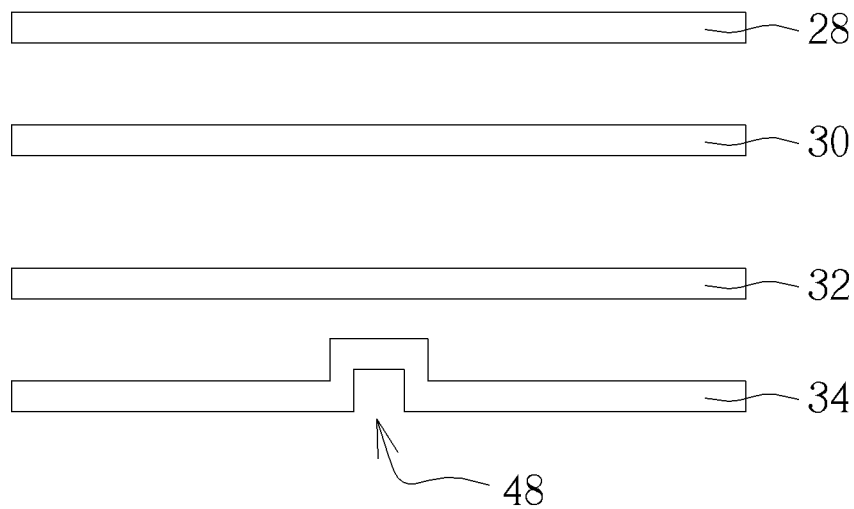

Next, as shown in FIG. 3, the sacrificial mandrels 14 and 16 are removed, and the spacers 24 and 26 adjacent to the sacrificial mandrels 14 and 16 are used as mask to remove part of the substrate 12 along with a fin-cut process to form fin-shaped structures 28, 30, 32 and a dummy fin-shaped structure 34 in the substrate 12. The spacers 24 and 26 could be removed after the fin-shaped structures 28, 30, 32 and dummy fin-shaped structure 34 are formed.

Figure 4:
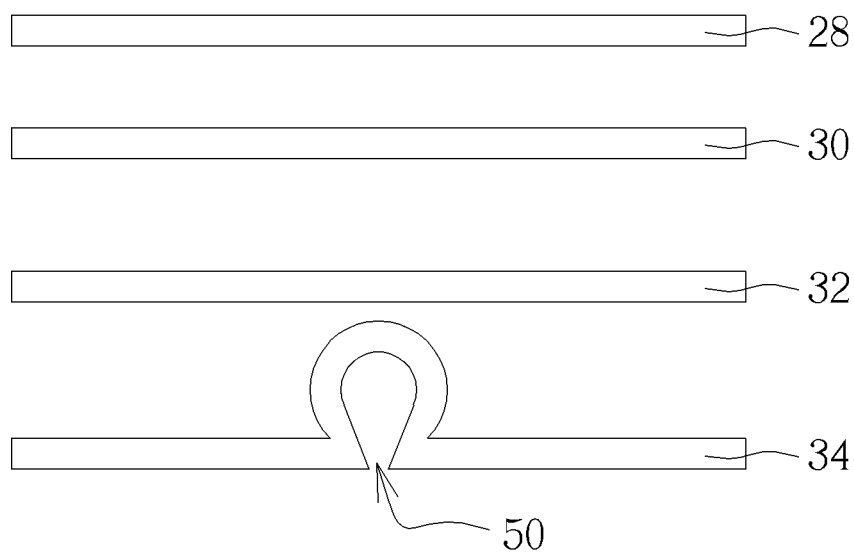

In this embodiment, the fin-cut process is preferably accomplished by conducting an etching process to remove front and back ends connecting the fin-shaped structures 28, 30, 32 and dummy fin-shaped structure 34 so that the originally circular fin-shaped structures 28, 30, 32 and dummy fin-shaped structure 34 are divided and separated into individual stripe-shaped patterns without contacting each other, in which gate structures would be formed on fin-shaped structures 28, 30, 32 in the later process while no gate structures will be formed on the dummy fin-shaped structure 34 thereafter. Since the fin-shaped structures 28, 30, 32 and dummy fin-shaped structure 34 are preferably formed by the transfer of the spacers 24 and 26 pattern, the position and pattern of the fin-shaped structures 28, 30, 32 and dummy fin-shaped structure 34 preferably correspond to the position and pattern of the aforementioned spacers 24 and 26. Specifically, the fins-shaped structures 28, 30, 32 are preferably straight rectangular patterns while the dummy fin-shaped structure 34 is a substantially rectangular pattern with a turning point, such as a substantially c-shaped twist 48 shown in FIG. 3. It should be noted that even though the turning point is represented by right angled curves in FIG. 3, the turning point under actual circumstance, such as after optical proximity effect (OPE), etching, and cleaning process, would reveal an omega shaped curve 50, as shown in FIG. 4.

Figure 5:
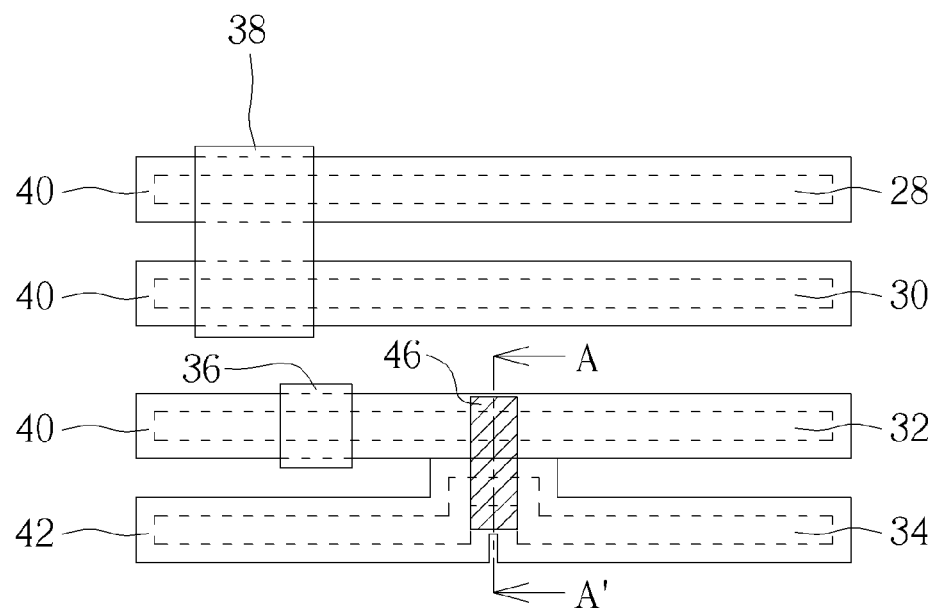
Figure 6:
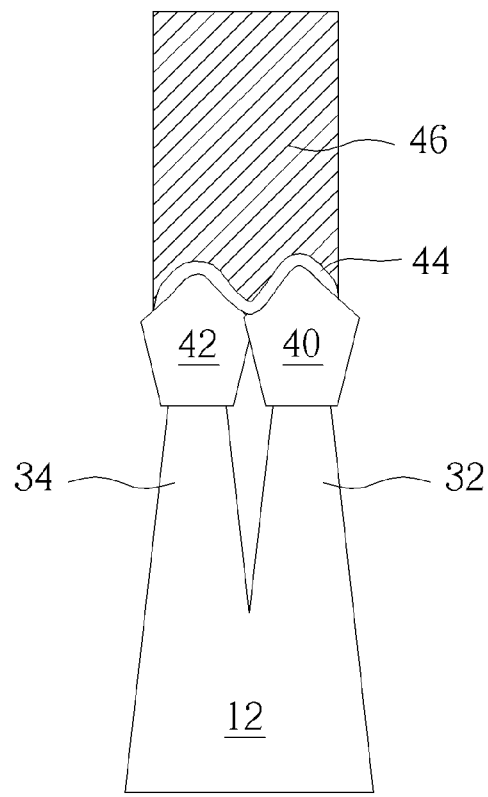
FIG. 6 illustrates a cross-sectional view of FIG. 5 along the sectional line AA'.

Referring to FIGS. 5 and 6, FIG. 6 illustrates a cross-sectional view of FIG. 5 along the sectional line AA'. As shown in FIGS. 5 and 6, a gate structure fabrication process is conducted by first forming agate structure 36 on the fin-shaped structure 32 and a gate structure 38 on the fin-shaped structures 28 and 30. The nature and composition of the gate structures 36 and 38 could vary depending on whether the gate structures are fabricated by a gate first process, high-k first process from gate last process, or high-k last process from gate last process. For instance, the gate structures 36 and 38 could include elements such as interfacial layer, high-k dielectric layer, bottom barrier metal (BBM) layer, polysilicon layer, and hard mask layer, and as the fabrication of gate structures are well known to those skilled in the art, the details of which are not explained herein for the sake of brevity.

Next, a first epitaxial layer 40 and a second epitaxial layer 42 are disposed on the fin-shaped structures 28, 30, 32 and dummy fin-shaped structure 34, in which the first epitaxial layer 40 is preferably formed on the fin-shaped structures 28, 30, 32 and adjacent to two sides of the gate structures 36 and 38 while the second epitaxial layer 42 is covered on the dummy fin-shaped structure 34 entirely. In this embodiment, the formation of the first epitaxial layer 40 and second epitaxial layer 42 could be accomplished by first selectively etching the fin-shaped structure 32 adjacent to two sides of the gate structures 36 and 38 to form recesses (not shown) or directly trimming the epitaxial layer, and then conducting a selective epitaxial growth process to grow the first epitaxial layer 40 in the recess and at the same time forming the second epitaxial layer 42 on the surface of the dummy fin-shaped structure 34. The composition of the first epitaxial layer 40 and second epitaxial layer 42 could be adjusted according to the type of the transistor being fabricated, such as silicon germanium or silicon phosphorus, but not limited thereto. It should be noted that elements such as spacer could be formed around the gate structures 36 and 38 and lightly doped drains and source/drain regions could be formed in the fin-shaped structures 38, 30, 32 adjacent to the gate structures 36 and 38 before or after forming the first epitaxial layer 40 and second epitaxial layer 42, and as the order and formation of these elements are well known to those skilled in the art, the details of which are not explained herein for the sake of brevity.

Next, a silicide process is conducted to form a silicide 44 on the first epitaxial layer 40 and second epitaxial layer 42, an interlayer dielectric (ILD) layer (not shown) is covered on the substrate 12 and gate structures 36 and 38, and at least one conductive plug 46 is formed in the ILD layer to electrically connect to the silicide 44. This completes the fabrication of a semiconductor device according to a preferred embodiment of the present invention.

Overall, the present invention preferably forms sacrificial mandrel on a substrate, removes part of the sacrificial mandrel to form an indentation during a sidewall image transfer (SIT) process, and then forms a spacer on the sidewall of the sacrificial mandrel. Due to the presence of the indentation, part of the spacer formed on the sidewall of the sacrificial mandrel would be retracted inward to form a turning point or curve so that after the pattern of the spacer is transferred to the substrate to form fin-shaped structures and dummy fin-shaped structure, the dummy fin-shaped structure would reveal a substantially omega-shaped curve. According to a preferred embodiment of the present invention, the design of the curve in the dummy fin-shaped structure could be used to reduce the gap or distance between the first epitaxial layer and second epitaxial layer grown on the fin-shaped structures and dummy fin-shaped structure respectively, and also allow the contact plug formed thereafter to contact and sit on the first epitaxial layer and second epitaxial layer simultaneously. This increases the overall contact area of the contact plug and reduces the resistance between the contact plug and epitaxial layer significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a fin-shaped structure on the substrate; and
   a dummy fin-shaped structure on the substrate and adjacent to the fin-shaped structure, wherein the fin-shaped structure and the dummy fin-shaped structure comprise same material and the dummy fin-shaped structure comprises a curve.

2. The semiconductor device of claim 1, wherein the curve is omega shaped.

* * * * *